(12) United States Patent
Lai et al.

(10) Patent No.: US 9,018,615 B2
(45) Date of Patent: Apr. 28, 2015

(54) RESISTOR RANDOM ACCESS MEMORY STRUCTURE HAVING A DEFINED SMALL AREA OF ELECTRICAL CONTACT

(75) Inventors: Erh-Kun Lai, Longjing Shiang (TW); ChiaHua Ho, Kaoshing (TW); Kuang Yeu Hsieh, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 370 days.

(21) Appl. No.: 11/833,563

(22) Filed: Aug. 3, 2007

(65) Prior Publication Data

US 2009/0032793 A1 Feb. 5, 2009

(51) Int. Cl.
*H01L 47/00* (2006.01)
*H01L 45/00* (2006.01)

(52) U.S. Cl.
CPC ............... *H01L 45/16* (2013.01); *H01L 45/06* (2013.01); *H01L 45/1233* (2013.01); *H01L 45/1273* (2013.01); *H01L 45/144* (2013.01)

(58) Field of Classification Search
CPC ... H01L 45/06; H01L 45/126; H01L 45/1273; H01L 45/16; H01L 45/1608
USPC .......... 257/3, 4, 5, E45.002, E29.17, E27.104
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 5,166,096 A | 11/1992 | Cote et al. |
| 5,166,758 A | 11/1992 | Ovshinsky et al. |
| 5,177,567 A | 1/1993 | Klersy et al. |
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |

(Continued)

FOREIGN PATENT DOCUMENTS

| | | |
|---|---|---|
| WO | 0079539 | 12/2000 |
| WO | 0145108 | 6/2001 |

OTHER PUBLICATIONS

Adler, David, "Amorphous-Semiconductor Devices," Sci. Amer., vol. 236, pp. 36-48, May 1977.

(Continued)

*Primary Examiner* — Vongsavanh Sengdara
(74) *Attorney, Agent, or Firm* — Haynes Beffel & Wolfeld LLP (57) ABSTRACT

A memory cell device, of the type that includes a memory material switchable between electrical property states by application of energy, includes first and second electrodes, a plug of memory material (such as phase change material) which is in electrical contact with the second electrode, and an electrically conductive film which is supported by a dielectric form and which is in electrical contact with the first electrode and with the memory material plug. The dielectric form is wider near the first electrode, and is narrower near the phase change plug. The area of contact of the conductive film with the phase change plug is defined in part by the geometry of the dielectric form over which the conductive film is formed. Also, methods for making the device include steps of constructing a dielectric form over a first electrode, and forming a conductive film over the dielectric form.

21 Claims, 7 Drawing Sheets

(56) References Cited

U.S. PATENT DOCUMENTS

| | | |
|---|---|---|
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 * | 8/2003 | Lee et al. ............ 257/2 |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,305 B2 | 5/2005 | Yi et al. |
| 6,897,467 B2 | 5/2005 | Doan et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 7,485,891 B2 | 2/2009 | Hamann et al. |
| 2004/0077123 A1 * | 4/2004 | Lee et al. ............ 438/102 |
| 2004/0115372 A1 * | 6/2004 | Lowrey ............ 428/34.1 |
| 2005/0029502 A1 | 2/2005 | Hudgens |
| 2005/0093022 A1 | 5/2005 | Lung |
| 2005/0201182 A1 | 9/2005 | Osada et al. |
| 2005/0212024 A1 | 9/2005 | Happ |
| 2005/0215009 A1 | 9/2005 | Cho |
| 2006/0011902 A1 * | 1/2006 | Song et al. ............ 257/4 |
| 2006/0108667 A1 | 5/2006 | Lung |
| 2006/0110878 A1 | 5/2006 | Lung et al. |
| 2006/0211165 A1 * | 9/2006 | Hwang et al. ............ 438/95 |
| 2006/0261392 A1 * | 11/2006 | Lee et al. ............ 257/296 |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0045605 A1 | 3/2007 | Hsueh |
| 2007/0045606 A1 * | 3/2007 | Magistretti et al. ............ 257/4 |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2008/0067486 A1 * | 3/2008 | Karpov et al. ............ 257/3 |

OTHER PUBLICATIONS

Adler, D. et al., "Threshold Switching in Chalcogenide-Glass Thin Films," J. Appl/ Phys 51(6), Jun. 1980, pp. 3289-3309.

(56) References Cited

OTHER PUBLICATIONS

Ahn, S.J. et al., "A Highly Manufacturable High Density Phase Change Memory of 64 Mb and Beyond," IEEE IEDM 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Axon Technologies Corporation paper: Technology Description, pp. 1-6.
Bedeschi, F. et al., "4-MB MOSFET-Selected Phase-Change Memory Experimental Chip," IEEE, 2004, 4 pp.
Blake thesis, "Investigation of GeTeSb5 Chalcogenide Films for Use as an Analog Memory," AFIT/GE/ENG/00M-04, Mar. 2000, 121 pages.
Chen, An et al., "Non-Volatile Resistive Switching for Advanced Memory Applications," IEEE IEDM , Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gibson, G. A. et al, "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y. H. et al., "An Edge Contact Type Cell fro Phase Change RAM Featuring Very Low Power Consumption," 2003 Symposium on VLSI Technology Digest of Technical Papers, pp. 175-176.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24?m-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge—Sn—Sb—Te Phase-change Recording Material Having High Crystallization Speed," Proceedings of PCOS 2000, pp. 36-41.
Lacita, A. L.; "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., OUM-A 180 nm Nonvolatile Memory Cell Element Technology for Stand Alone and Embedded Applications, IEEE IEDM 2001, pp. 803-806.
Lankhorst, Martin H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org <http://www.sciencenews.org>, Dec. 18 & 25, 2004, p. 389, vol. 166.
Mott, Nevill, "Electrons in Glass," Nobel Lecture, Dec. 8, 1977, Physics, 1977, pp. 403-413.
"New Memories Tap Spin, Gird for Battle," Science News, Apr. 3, 1999, p. 223, vol. 155.
"Optimized Thermal Capacitance in a Phase Change Memory Cell Design", IPCOM000141986D, IP.com Prior Art Database, Oct. 18, 2006, 4 pp.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al., "Novel ?Trench Phase-Change Memory Cell for Embedded and Stand-Alone Non-Volatile Memory Applications," 2004 Symposium on VLSI Technology Digest of Technical Papers, pp. 18-19.
Pirovano, Agostino et al., "Reliability Study of Phase-Change Non-volatile Memories," IEEE Transactions on Device and Materials Reliability, Sep. 2004, pp. 422-427, vol. 4, No. 3.
Prakash, S. et al., "A Guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
"Remembering on the Cheap," www.sciencenews.org <http://www.sciencenews.org>, Mar. 19, 2005, p. 189, vol. 167.
Rochefort, C. et al., "Manufacturing of High Aspect-Ration p-n Junctions Using Vapor Phase Doping for Application in Multi-Resurf Devices," IEEE 2002.
Strauss, Karl F. et al., "Overview of Radiation Tolerant Unlimited Write Cycle Non-Volatile Memory," IEEE 2000.
Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.
Wicker, Guy et al., Nonvolatile, High Density, High Performance Phase Change Memory, 1999, 'http://klabs.org/richcontent/MAPLDCon99/Papers/P21_Tyson_P.PDF#search= nonvolatile%20high%20density%20high%20performance%20-phase%20change%20memory <http://klabs.org/richcontent/MAPLDCon99/Papers/P21_Tyson_P.PDF#search=' nonvolatile%20high%20density%20high%20performance%20-phase%20change%20memory>', 8 pages.
Wicker, Guy, "A Comprehensive Model of Submicron Chalcogenide Switching Devices," Doctoral Dissertation, Wayne State University, Detroit, MI, 1996.
Wolf, Stanley, Excerpt from: Silicon Processing for the VLSI Era-vol. 4, pp. 674-679, 2004.
Wuttig, Matthias, "Towards a Universal Memory?" Nature Materials, Apr. 2005, pp. 265-266, vol. 4.
Yi, J. H. et al., "Novel Cell Structure of PRAM with Thin Metal Layer Inserted GeSbTe," IEEE IEDM 2003, 4 pages.
Yonehara, T. et al., "Control of Grain Boundary Location by Selective Nucleation Over Amorphous Substrates," Mat. Res. Soc. Symp. Proc., vol. 106, 1998, pp. 21-26.
"Thermal Conductivity of Crystalline Dielectrics" in CRC Handbook of Chemistry and Physics, Internet Version 2007, (87th edition), David R. Lide, ed. Taylor and Francis, Boca Raton, FL.
Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

* cited by examiner

RESISTOR RANDOM ACCESS MEMORY STRUCTURE HAVING A DEFINED SMALL AREA OF ELECTRICAL CONTACT

BACKGROUND

1. Field of the Invention

This invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, such as chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. It is desirable therefore to provide a memory cell structure having small dimensions and low reset currents, and a method for manufacturing such structure.

SUMMARY

Generally, the invention features a memory cell device of the type that includes a memory material switchable between electrical property states by application of energy. The memory cell device has first and second electrodes, a plug of memory material (such as phase change material) which is in electrical contact with the second electrode, and an electrically conductive film which is supported by a dielectric form and which is in electrical contact with the first electrode and with the memory material plug. The dielectric form is wider near the first electrode, and is narrower near the phase change plug. The area of contact of the conductive film with the phase change plug is defined in part by the geometry of the dielectric form over which the conductive film is formed.

In one general aspect the invention features a memory cell device including first and second electrodes, a plug of memory material (such as phase change material) which is in electrical contact with the second electrode, and an electrically conductive film which is supported by a dielectric form and which is in electrical contact with the first electrode and with the memory material plug.

In various embodiments the dielectric form is wider near the first electrode, and is narrower near the phase change plug, the dielectric form may be shaped as a cone (with a generally circular or elliptical base); a pyramid (with a generally rectangular or square base); a wedge (with an elongated generally rectangular base); or a truncated cone or pyramid or wedge. Where the form is truncated the area of contact of the conductive film with the phase change plug is defined in part by the area of the truncation, which may be controlled for precision and accuracy by the process of shaping the dielectric form.

The electrically conductive film contacts edge portions of the first electrode. Accordingly, the conductive film is a shell, and the shape of the conductive film is defined in part by the shape of the dielectric form and in part by the edge portions of the first electrode.

In another general aspect the invention features a method for making a memory cell device, by: providing a substrate having an intermetal dielectric at a surface; forming a first electrode layer over the intermetal dielectric, and patterning the first electrode layer to form first (bottom) electrodes; depositing a first dielectric material over the substrate and the bottom electrodes; removing a portion of the first dielectric material to expose edge portions of the bottom electrodes and to leave shaped dielectric forms on the bottom electrodes and a first dielectric layer between the bottom electrodes; forming a film of an electrically conductive material over the dielectric forms and the exposed edges of the bottom electrodes; forming a cap film over the electrically conductive film; patterning the cap film and the electrically conductive film to isolate conductive films and cap films over individual electrodes; depositing a second dielectric material over the cap films and the first dielectric layer; removing a portion of the second dielectric material to expose portions of the cap films; removing exposed portions of the cap films to expose areas of the electrically conductive films; depositing a phase change material over the exposed areas of the electrically conductive films and the second dielectric layer; depositing a second electrode layer over the phase change material layer; and patterning the second electrode layer and the phase change material layer to form isolated phase change plugs in contact with the exposed areas of the electrically conductive films and second electrodes.

The various steps in the method may be carried out in any of a variety of processes, of which a few examples follow. The substrate may be provided as a wafer having a layer of oxide on a semiconductor such as silicon or gallium arsenide, or having a back end of line (BEOL) layer. The dielectric material may be deposited in a high density plasma (HDP) process, which may be a chemical vapor deposition process (HDP-CVD) or a fluorinated silica glass process (HDP-FSG), or a phosphosilicate glass process (HDP-PSG), or a silicon nitride process (HDP-SIN), or a boron-doped phosphosilicate glass process (HDP-BPSG). The first dielectric material may be removed by a selective etch process such as a selective wet etch or a selective dry etch. The film of electrically conductive material may be formed by sputtering, such as by DC sputtering; for a TiN material a gas mixture of Ar and $N_2$ may be flowed through the chamber, and a Ti target may be employed. The cap film may be formed as a film of a material having a higher CMP selectivity as compared with the second dielectric material to be deposited subsequently. The second dielectric material may be deposited as an oxide, or as a fluorinated silica glass (FSG) or as a low-K dielectric (having a lower dielectric constant than silicon dioxide, for example). The cap film may be formed in a vapor deposition process; for a SiN cap film a gas mixture of $SiH_4$ and $N_2$ may be flowed through the chamber under conditions of controlled pressure and RF power. The cap film and electrically conductive film may be patterned in a mask and etch process. The removal of a portion of the second dielectric material may be by a CMP process, such as material selective CMP process; where the electrically conductive material is TiN and the second dielectric material is silicon dioxide, for example, the CMP process may employ a $CeO_2$ slurry. Or, the removal of a portion of the second dielectric material may be by a CMP process, followed by an etch where the electrically conductive material is TiN and the second dielectric material is silicon dioxide, for example, the CMP process may employ a $CeO_2$ slurry, and the etch may be a HF etch.

In at least some embodiments the shape and the size of the area of contact of the phase change plug and the conductive film is determined at least in part by the shape and dimensions of the dielectric form upon which the conductive film is formed; and in at least some embodiments the shape and the size of the area of contact of the phase change plug and the conductive film is determined at least in part by the shape and dimensions of the exposed surface of the cap film,

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS.

Figure 1A:
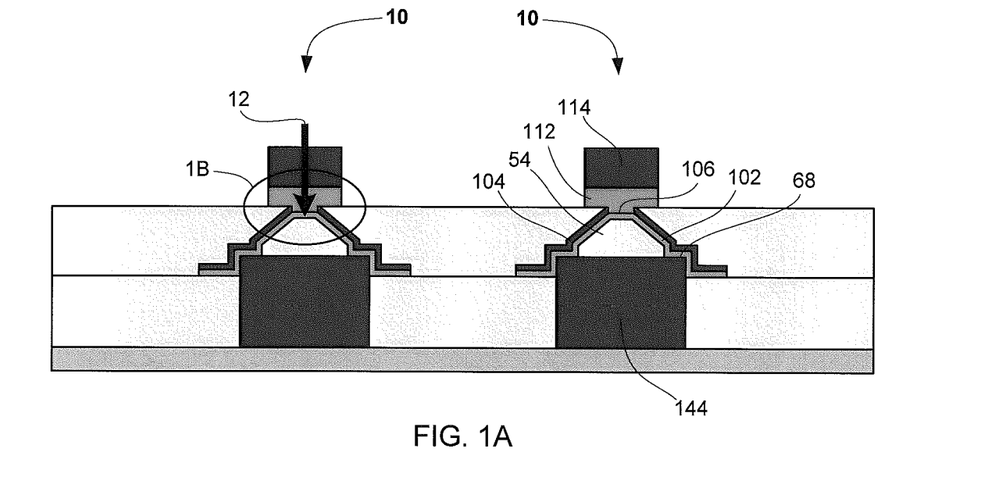
FIG. 1A is a diagrammatic sketch in a sectional view showing two adjacent memory cell devices according to an embodiment of the invention.
Figure 1B:
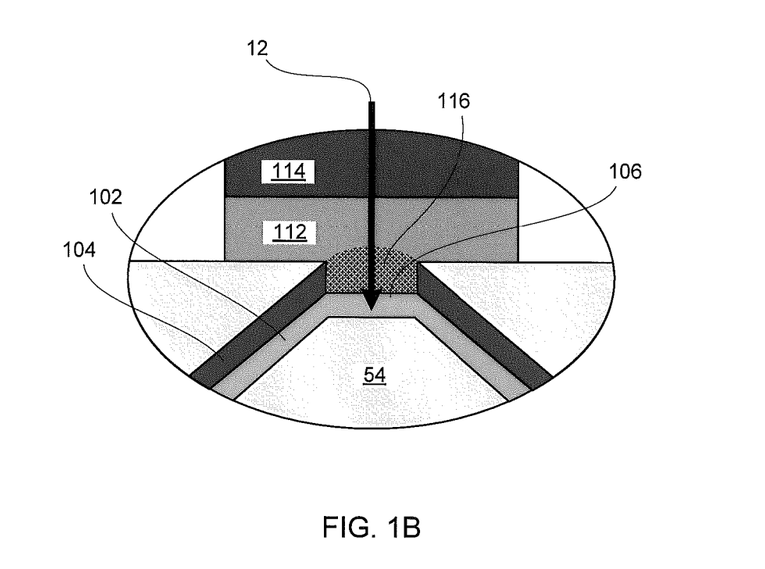
FIG. 1B is a diagrammatic sketch in a sectional view showing one of the memory cell devices as in FIG. 1A, enlarged.

Turning now to FIGS. 1A, 1B, there is shown a phase change memory cell 10 according to an embodiment of the invention. The memory cell includes a bottom electrode 144, an electrically conductive film 102, a cap film 104, a phase change material plug 112, and a top electrode 114. The electrically conductive film is supported by a dielectric form 54, which is wider at the bottom, where it rests upon the bottom electrode, and is narrower at the top. Various shapes for the dielectric form are contemplated, including for example: a cone (with a generally circular or elliptical base); a pyramid (with a generally rectangular or square base); a wedge (with an elongated generally rectangular base); or, in embodiments as in FIGS. 1A, 1B, a truncated cone or pyramid or wedge. The electrically conductive film 102 contacts edge portions 68 of the bottom electrode 144. Accordingly, the conductive film is a shell, and the shape of the conductive film is defined in part by the shape of the dielectric form and in part by the edge portions of the bottom electrode. An opening through the cap film 104 exposes a small limited area 106 of the surface of the conductive film 102 at the top, and the phase change plug 112 makes contact with the conductive film at this limited area. The top electrode 114 contacts the top surface of the phase change plug 112. Current flows through the cell as indicated generally by the arrow 12; more particularly, the current flows from the top electrode through the phase change plug, to the conductive film across the limited area defined by the opening through the cap film, and through the conductive film to the bottom electrode by way of contact of the conductive film with the edge portions of the bottom electrode.

Figure 2A:
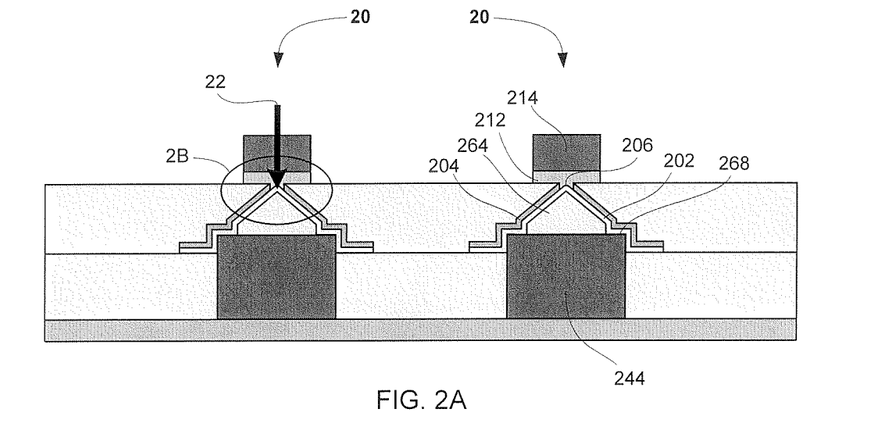
FIG. 2A is a diagrammatic sketch in a sectional view showing two adjacent memory cell devices according to another embodiment of the invention.
Figure 2B:
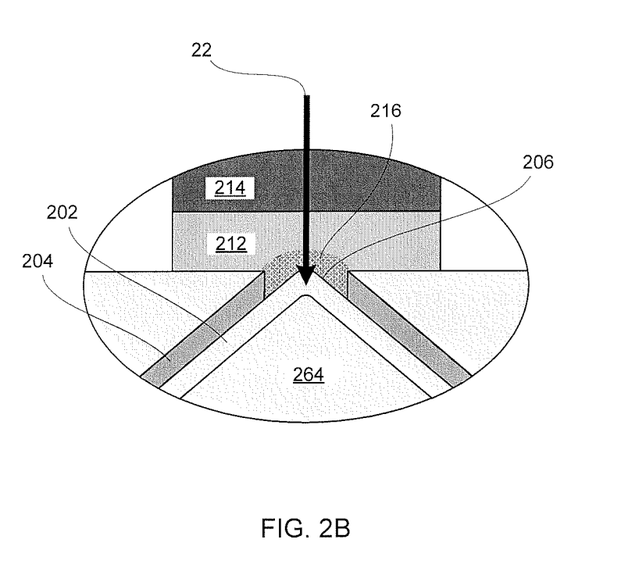
FIG. 2B is a diagrammatic sketch in a sectional view showing one of the memory cell devices as in FIG. 2A, enlarged.

Referring now to FIGS. 2A, 2B, there is shown a phase change memory cell 20 according to another embodiment of the invention. The memory cell includes a bottom electrode 244, an electrically conductive film 202, a cap film 204, a phase change material plug 212, and a top electrode 214. The electrically conductive film is supported by a dielectric form 264, which is wider at the bottom, where it rests upon the bottom electrode, and is narrower at the top. The dielectric form contemplated in embodiments as in FIGS. 2A, 2B is not truncated (as they are in embodiments as in FIGS. 1A, 1B), and the various shapes including for example: a cone (with a generally circular or elliptical base); a pyramid (with a generally rectangular or square base); or a wedge (with an elongated generally rectangular base). The electrically conductive film 202 contacts edge portions 268 of the bottom electrode 244. Accordingly, the conductive film is a shell, and the shape of the conductive film is defined in part by the shape of the dielectric form and in part by the edge portions of the bottom electrode. An opening through the cap film 204 exposes a small limited area 206 of the surface of the conductive film 202 at the top, or apex, and the phase change plug 212 makes contact with the conductive film at this limited area. The top electrode 214 contacts the top surface of the phase change plug 212. Current flows through the cell as indicated generally by the arrow 22; more particularly, the current flows from the top electrode through the phase change plug, to the conductive film across the limited area defined by the opening through the cap film, and through the conductive film to the bottom electrode by way of contact of the conductive film with the edge portions of the bottom electrode.

Embodiments of the memory cell include phase change based memory materials, including chalcogenide based materials and other materials, for the memory material (112. 212). Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In the disclosure herein, the phase change material is referred to as GST, and it will be understood that other types of phase change materials can be used. A material useful for implementation of a memory device described herein is $Ge_2Sb_2Te_5$.

With reference again to FIGS. 1A, 1B, or 2A, 2B, access circuitry can be implemented to contact the first electrode 144 (244) and the second electrode 114 (214) in a variety of configurations for controlling the operation of the memory cell, so that it can be programmed to set the phase change material 112 (212) in one of the two solid phases that can be reversibly implemented using the memory material. For example, using a chalcogenide-based phase change memory material, the memory cell may be set to a relatively high resistivity state in which at least a portion of the bridge in the current path is an amorphous state, and a relatively low resistivity state in which most of the bridge in the current path is in a crystalline state. For example, application of an electrical pulse having a suitable shorter, high amplitude profile, for example, results in changing the phase change material 112 (212) locally to a generally amorphous state, as indicated at 116 in FIG. 1B (216 in FIG. 2B).

Figure 3:
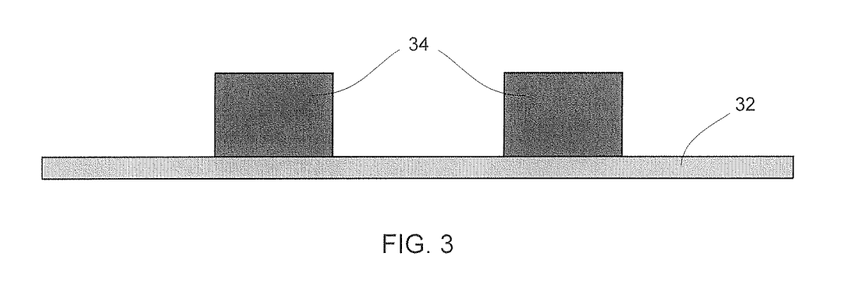
FIG. 3 is a diagrammatic sketch in a sectional view showing a stage in a process for constructing a device according to an embodiment of the invention, following deposition and patterning of bottom electrodes.

A memory cell structure according to an embodiment of the invention as shown for example in FIGS. 1A and 1B (or, similarly, in FIGS. 2A and 2B) can be constructed as shown with reference to FIGS. 3 through 10. Referring now to FIG. 3, a layer of an electrically conductive material suitable as a bottom electrode is deposited upon a dielectric substrate 32 and patterned, for example by masking and etching, to form bottom electrodes 34. Suitable substrates include, for example, an oxide on silicon or gallium arsenide; or a back end of line (BEOL) layer, as in a PCRAM construct.

Figure 4:
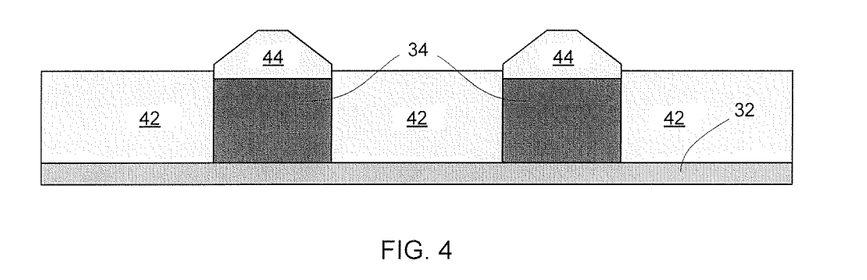
FIG. 4 is a diagrammatic sketch in a sectional view showing a stage in a process for constructing a device according to an embodiment of the invention, following deposition of dielectric over the bottom electrodes and the substrate formed as shown in FIG. 3.

Then a layer of a dielectric material, such as for example a silicon dioxide, is formed over the substrate, covering the patterned bottom electrodes, as shown in FIG. 4. The dielectric material covers the substrate 32 as shown at 42 in FIG. 4 and also covers the patterned bottom electrodes 34 as shown at 44 in FIG. 4. The dielectric material layer may be formed, for example, by high density plasma chemical vapor depositions (HDP-CVD). The layer may have a thickness in the range about 500 A to 2000 A, such as about 1000 A. The layer may be formed, for example, by a high density plasma (HDP) process, and may include HDP fluorinated silica glass (HDP FSG), or HDP phosphosilicate glass (HDP PSG), or HDP SIN, or HDP boron-doped phosphosilicate glass (HDP BPSG), for example.

Figure 5:
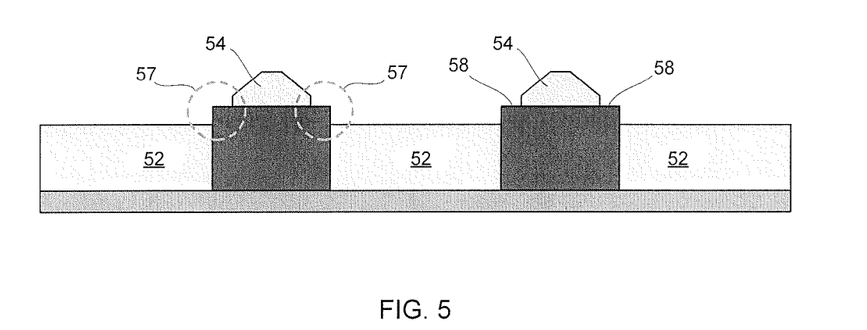
FIG. 5 is a diagrammatic sketch in a sectional view showing a stage in a process for constructing a device according to an embodiment of the invention, following wet etch of the dielectric layer formed as shown in FIG. 4, to expose shoulders of the bottom electrode.

Then a portion of the dielectric layer is removed, as shown in FIG. 5, to expose edge portions 58 of the bottom electrodes, as indicated by the circles 57. A remaining portion 52 of the dielectric layer 42 covers the substrate adjacent the patterned electrodes 34, and a portion of the dielectric layer remains over each patterned electrode 34, constituting a form 54 upon which the electrically conductive film is to be formed. The material may be removed by, for example, a wet etch using a high etch selectivity ratio between the dielectric layer 42, 44 material and the bottom electrode 34 material. The materials should be selected accordingly; for example, if the dielectric layer material is silicon dioxide, then the bottom electrode material can be, for example, TaN or TiN. The electrode material is selected for compatibility with the programmable resistive memory material, and to act as a diffusion barrier between the conductive material and a phase change material. Alternatively, the electrode material may be TiAlN or TaAlN, or may comprise, as further examples, one or more elements selected from the group consisting of Ti, W, Mo, Al, Ta, Cu, Pt, Ir, La, Ni, and Ru and alloys thereof.

Figure 6:
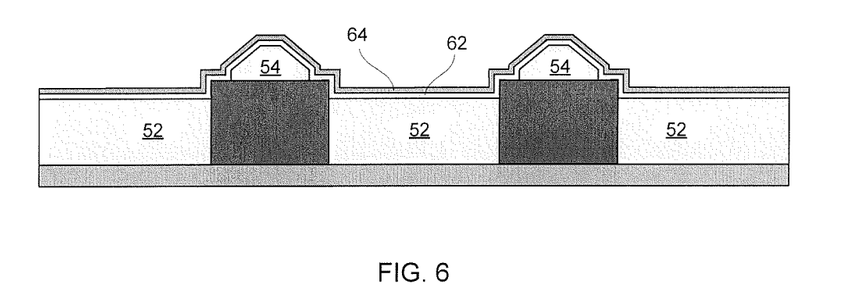
FIG. 6 is a diagrammatic sketch in a sectional view showing a stage in a process for constructing a device according to an embodiment of the invention, following deposition of a conductive film and a cap film over a structure as shown in FIG. 5.

Then a film of an electrically conductive material is formed over the structure shown in FIG. 5, as illustrated at 62 in FIG. 6. The conductive film 62 covers the surface of the dielectric layer 52 over the substrate 32, the forms 54, and the edge portions 58 of the bottom electrodes 34. Suitable materials for the conductive film include, for example, TiN and TaN. The electrode material is selected for compatibility with the programmable resistive memory material, and to act as a diffusion barrier between the conductive material and a phase change material. Alternatively, the electrode material may be TiAlN or TaAlN, or may comprise, for further examples, one or more elements selected from the group consisting of Ti, W, Mo, Al, Ta, Cu, Pt, Ir, La, Ni, and Ru and alloys thereof. The electrically conductive film 62 has a thickness in the range about 22 angstroms to about 500 angstroms, usually about 50 angstroms.

Suitable methods for forming the electrically conductive film include, for example, sputtering. For deposition of TiN, for example, DC sputtering can be carried out using a gas mixture of Ar and $N_2$ and a Ti target. Deposition time will depend upon DC power level, for example about 4 sec at 6500 W power, and a longer duration at lower power, such as 1500 W. Then a cap film is formed over the electrically conductive film 62, as illustrated at 64 in FIG. 6. Suitable materials for the cap film include, for example, SiN. Other cap film materials may be employed; the cap film 64 should be of a material having a higher CMP selectivity to the material of the dielectric layer 82 to be formed subsequently (see FIG. 8), and SiN may be preferred for the cap film. Layer 82 could be an oxide, a fluorine-doped silica glass (FSG), or lower K dielectric, for example. Selectivity to oxide >50 can readily be obtained, using a $CeO_2$ slurry as the CMP slurry, for example; that is, under such circumstances treatment sufficient to remove 500 angstroms removes only about 10 angstroms from the SiN layer. The dielectric layer could replace SiN if higher CMP selectivity to dielectric layer 82. The cap film 64 has a thickness in the range about 100 angstroms to about 1000 angstroms, for example about 200 angstroms. Suitable methods for forming the cap film include, for SiN for example, deposition under the following conditions: $SiH_4$, about 195 sccm; $N_2$, about 8000 sccm; RF power, about 300 W; pressure, about 2.6 torr. The thickness of the resulting film can be controlled by controlling the deposition time.

Figure 7:
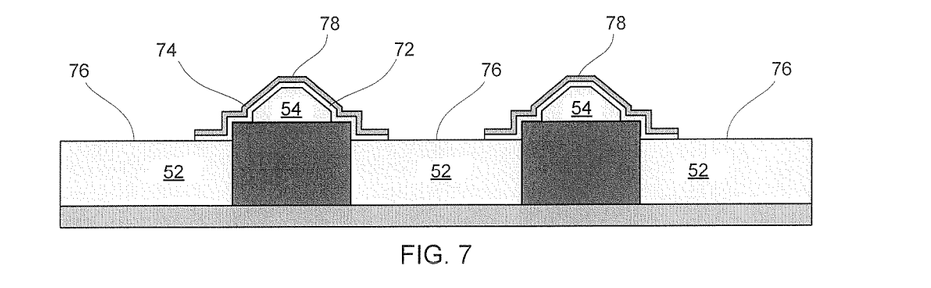
FIG. 7 is a diagrammatic sketch in a sectional view showing a stage in a process for constructing a device according to an embodiment of the invention, following patterning of the conductive film and the cap film formed as shown in FIG. 6.

Then the electrically conductive film and the cap film are patterned, for example in a mask-and-etch process, to isolate the conductive films 72 and cap films 74 over individual electrodes, as shown in FIG. 7. This exposes areas 76 of the surface of the dielectric layer 52. As illustrated in FIG. 7, the films are shells whose shapes are determined in part by the forms 54. Particularly, the shells 72, 74 are wide at the bottom where the conductive shell 72 contacts edge portions of the bottom electrode, and narrow at the top, where the cap shell 74 has a small area 78 at the top, where the shells are formed over the truncation at the top of the form 54.

Figure 8:
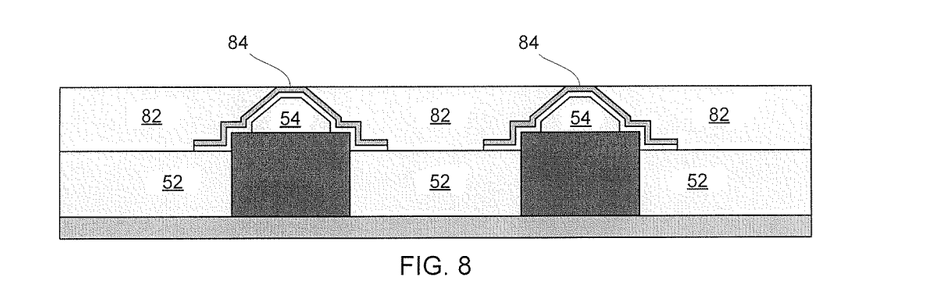
FIG. 8 is a diagrammatic sketch in a sectional view showing a stage in a process for constructing a device according to an embodiment of the invention, following deposition of a dielectric over the structure as shown in FIG. 7 and planarization of the dielectric layer to expose small portions of the cap film.

Then a second dielectric layer is formed over the isolated films and the exposed surfaces of the dielectric layer, and a portion of the second dielectric layer is removed to expose the small areas 84 at the top of the cap film shells 74, and leaving portions 82 of the second dielectric layer, as illustrated in FIG. 8. The materials may be removed by, for example, either of various processes. In a first process, the upper portion of the second dielectric layer is removed by chemical mechanical polishing (CMP) to planarize the layer down to the small areas 84. It may be important to limit the extent of planarization in order to control the size of the exposed areas 84 of the cap film, and to control thereby the contact area of the phase change material with the electrically conductive film (see FIGS. 9 and 10). Generally, removal of the layer 82 should be stopped at the point where the top of the cap film is exposed, or in any event before a significant amount of the cap film material has been removed, and preferably before the top surface 106 of the conductive film is exposed; this may be accomplished during CMP, for example, by end point detection. Or, a material selective CMP can be applied. For example, where the dielectric material is a silicon dioxide and the cap film material is SiN, a $CeO_2$ slurry can be employed, as it provides a higher selectivity (Oxide:SiN>50:1). The polish can be stopped on a small area 84.

Alternatively, for example, a two-step process can be employed, including a $CeO_2$ slurry in a CMP planarization, followed by a HF dip to expose a small area of the cap film.

Figure 9:
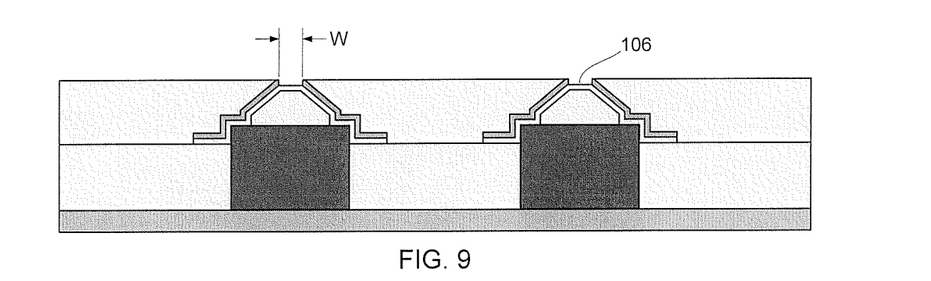
FIG. 9 is a diagrammatic sketch in a sectional view showing a stage in a process for constructing a device according to an embodiment of the invention, following removal of exposed portions of the cap layer of the structure as shown in FIG. 8, to expose small areas of the conductive film.

Then the exposed small areas 84 of the cap material are removed to form openings in the cap shell 74, as shown at W in FIG. 9, exposing a small area of the electrically conductive layer 72, leaving an electrically conductive shell 102 having a defined small area 106 exposed as shown in FIG. 9. The cap material can be removed, for example, by etch, selective to the material of the cap film material.

Figure 10:
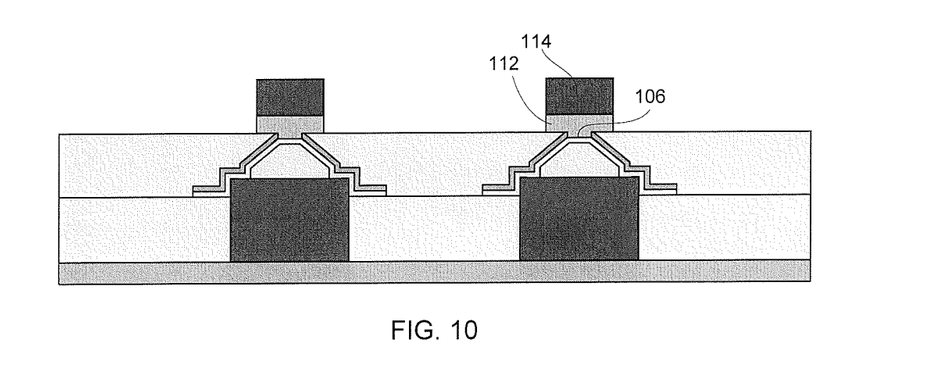
FIG. 10 is a diagrammatic sketch in a sectional view showing a stage in a process for constructing a device according to an embodiment of the invention, following deposition of a phase change material layer and a top electrode material layer over a structure as in FIG. 9, and patterning to form phase change plugs and top electrodes.

Then a layer of a phase change material is deposited over the structure shown in FIG. 9, and a layer of an electrically conductive material suitable as a top electrode is formed over the phase change material layer; and the layers are patterned to form phase change plugs 112 overlain by top electrodes 114, as shown for example in FIG. 10.

The process is controlled to define the width of the area 106 to within a range, for example, about 100 angstroms and about 500 angstroms. The shape of the forms 54 (and the dimensions of the can be readily controlled to good precision and accuracy by controlling the HDP deposition.

Figure 11:
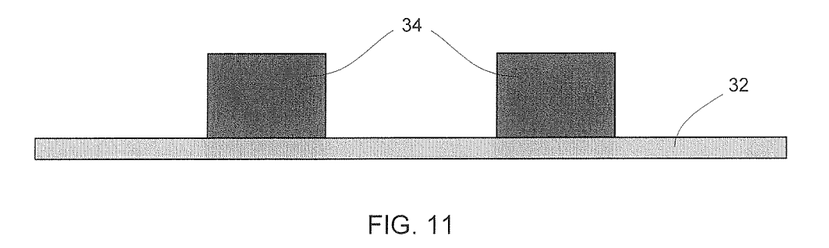
FIGS. 11-18 are diagrammatic sketches in a sectional view showing stages in a process for constructing a device according to another embodiment of the invention.

A memory cell structure according to an embodiment of the invention as shown for example in FIGS. 2A and 2B can be constructed as shown with reference to FIGS. 11 through 18. Referring now to FIG. 11, a layer of an electrically conductive material suitable as a bottom electrode is deposited upon a dielectric substrate 32 and patterned, for example by masking and etching, to form bottom electrodes 34. Suitable substrates include, for example, an oxide on silicon or gallium arsenide; or a BEOL layer, as in a PCRAM construct.

Figure 12:
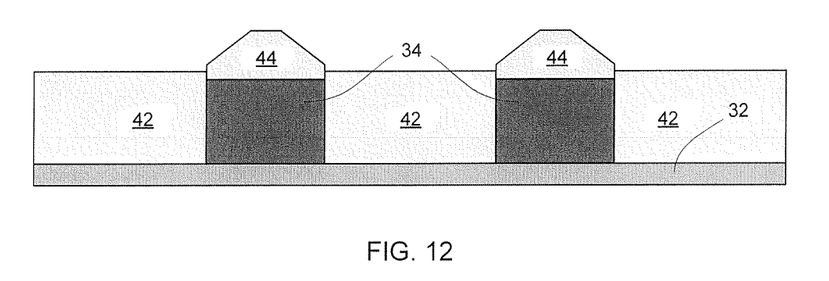

Then a layer of a dielectric material, such as for example a silicon dioxide, is formed over the substrate, covering the patterned bottom electrodes, as shown in FIG. 12. The dielectric material covers the substrate 32 as shown at 42 in FIG. 12 and also covers the patterned bottom electrodes 34 as shown at 44 in FIG. 4. The dielectric material layer may be formed, for example, by high density plasma chemical vapor depositions (HDP-CVD). The layer may have a thickness in the range about 500 Å to 2000 Å, such as about 1000 Å. The layer may be formed, for example, by a high density plasma (HDP) process, and may include HDP fluorinated silica glass (HDP FSG), or HDP phosphosilicate glass (HDP PSG), or HDP SIN, or HDP boron-doped phosphosilicate glass (HDP BPSG), for example.

Figure 13:
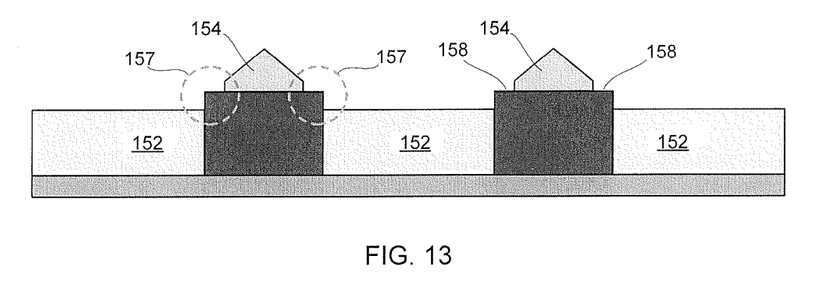

Then a portion of the dielectric layer is removed, as shown in FIG. 13, to expose edge portions 158 of the bottom electrodes, as indicated by the circles 157. A remaining portion 152 of the dielectric layer 42 covers the substrate adjacent the patterned electrodes 34, and a portion of the dielectric layer remains over each patterned electrode 34, constituting a form 154 upon which the electrically conductive film is to be formed. The material may be removed by, for example, a wet etch using a high etch selectivity ratio between the dielectric layer 42, 44 material and the bottom electrode 34 material. The materials should be selected accordingly; for example, if the dielectric layer material is silicon dioxide, then the bottom electrode material can be, for example, TaN or TiN. The electrode material is selected for compatibility with the programmable resistive memory material, and to act as a diffusion barrier between the conductive material and a phase change material. Alternatively, the electrode material may be TiAlN or TaAlN, or may comprise, as further examples, one or more elements selected from the group consisting of Ti, W, Mo, Al, Ta, Cu, Pt, Ir, La, Ni, and Ru and alloys thereof.

Figure 14:
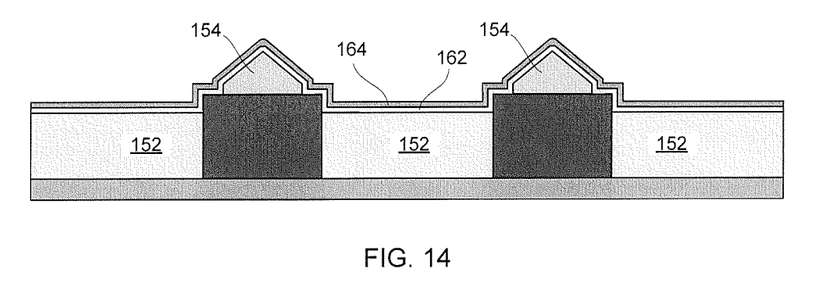

Then a film of an electrically conductive material is formed over the structure shown in FIG. 13, as illustrated at 162 in FIG. 14. The conductive film 162 covers the surface of the dielectric layer 152 over the substrate 32, the forms 154, and the edge portions 158 of the bottom electrodes 34. Suitable materials for the conductive film include, for example, TiN and TaN. The electrode material is selected for compatibility with the programmable resistive memory material, and to act as a diffusion barrier between the conductive material and a phase change material. Alternatively, the electrode material may be TiAlN or TaAlN, or may comprise, for further examples, one or more elements selected from the group consisting of Ti, W, Mo, Al, Ta, Cu, Pt, Ir, La, Ni, and Ru and alloys thereof. The electrically conductive film 162 has a thickness in the range about 22 angstroms to about 500 angstroms, usually about 50 angstroms. Then a cap film is formed over the electrically conductive film 162, as illustrated at 164 in FIG. 14. Suitable materials for the cap film include, for example, SiN. Other cap film materials may be employed; the cap film 164 should be of a material having a higher CMP selectivity to the material of the dielectric layer 182 to be formed subsequently (see FIG. 16), and SiN may be preferred for the cap film, as described above. Of course, the dielectric layer could replace SiN if higher CMP selectivity to dielectric layer 182. The cap film 164 has a thickness in the range about 100 angstroms to about 1000 angstroms, for example about 200 angstroms. Suitable methods for forming the cap film include, for example, deposition, as described above.

Figure 15:
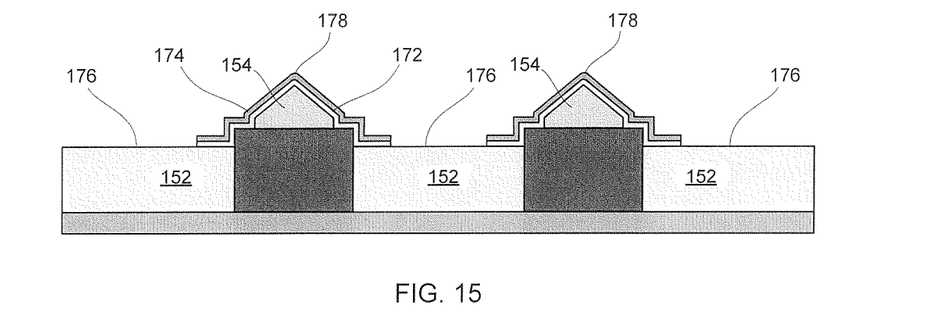

Then the electrically conductive film and the cap film are patterned, for example in a mask-and-etch process, to isolate the conductive films 172 and cap films 174 over individual electrodes, as shown in FIG. 15. This exposes areas 176 of the surface of the dielectric layer 152. As illustrated in FIG. 15, the films are shells whose shapes are determined in part by the forms 154. Particularly, the shells 172, 174 are wide at the bottom where the conductive shell 172 contacts edge portions of the bottom electrode, and narrow at the top, where the cap shell 174 has a small area 178 at the top, where the shells are formed over the apex of the form 54.

Figure 16:
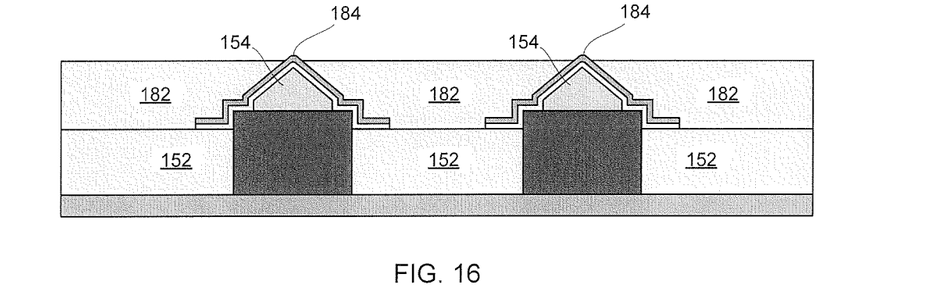

Then a second dielectric layer is formed over the isolated films and the exposed surfaces of the dielectric layer, and a portion of the second dielectric layer is removed to expose small areas 184 at the top of the cap film shells 174, and leaving portions 182 of the second dielectric layer, as illustrated in FIG. 16. The materials may be removed by, for example, either of various processes. In a first process, the upper portion of the second dielectric layer is removed by chemical mechanical polishing (CMP) to planarize the layer down to the small areas 184. It may be important to limit the extent of planarization in order to control the size of the exposed areas 184 of the cap film, and to control thereby the contact area of the phase change material with the electrically conductive film (see FIGS. 17 and 18). Generally, removal of the layer 182 should be stopped at the point where a limited part of the top of the cap film is exposed, or in any event before a significant amount of the cap film material has been removed, and preferably before the top surface 206 of the conductive film is exposed; this may be accomplished during CMP, for example, by end point detection. Or, a material selective CMP can be applied. For example, where the dielectric material is a silicon dioxide and the cap film material is SiN, a $CeO_2$ slurry can be employed, as it provides a higher selectivity (Oxide:SiN >50:1). The polish can be stopped upon exposure of the small area 84.

Alternatively, for example, a two-step process can be employed, including a $CeO_2$ slurry in a CMP planarization, followed by a HF dip to expose a small area of the cap film.

Figure 17:
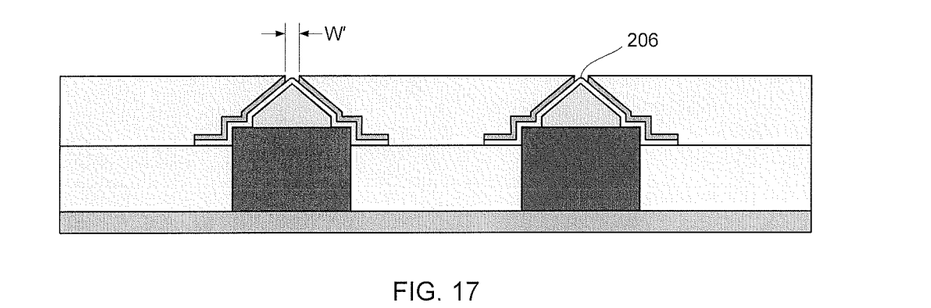

Then the exposed small areas 184 of the cap material are removed to form openings in the cap shell 174, as shown at W' in FIG. 17, exposing a small area of the electrically conductive layer 172, leaving an electrically conductive shell 202 having a defined small area 206 exposed as shown in FIG. 17. The cap material can be removed, for example, by etch, selective to the material of the cap film material.

Figure 18:
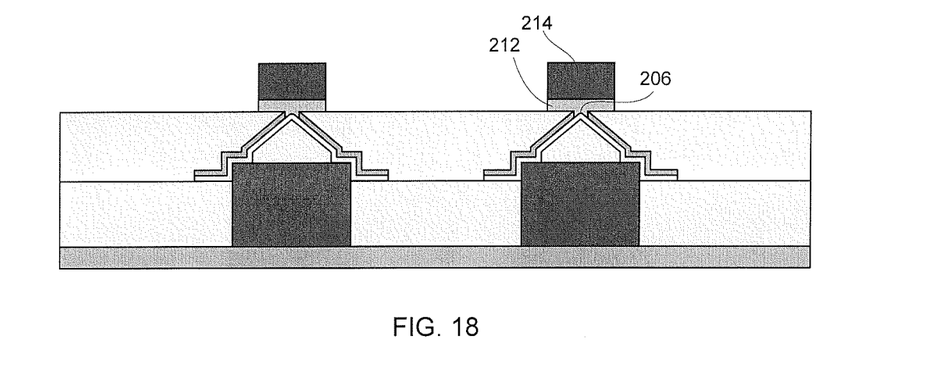

Then a layer of a phase change material is deposited over the structure shown in FIG. 17, and a layer of an electrically conductive material suitable as a top electrode is formed over the phase change material layer; and the layers are patterned to form phase change plugs 212 overlain by top electrodes 214, as shown for example in FIG. 18.

Figure 19:
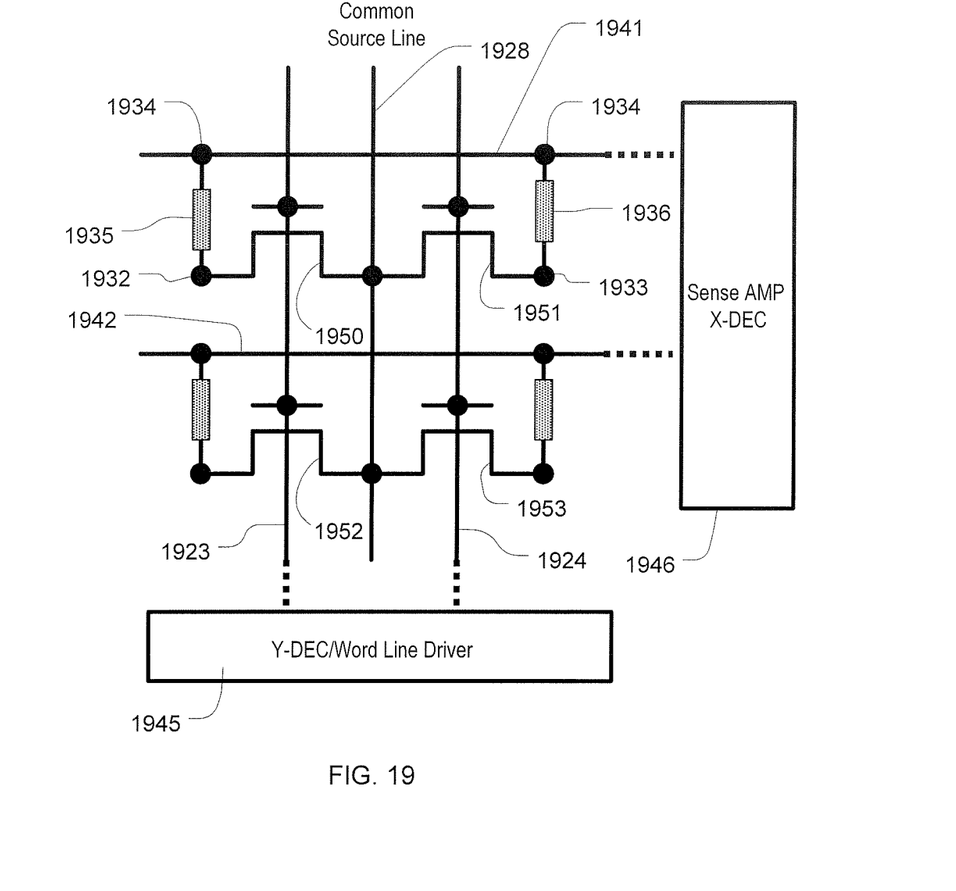
FIG. 19 is a schematic diagram for a memory array comprising phase change memory elements.

FIG. 19 is a schematic illustration of a memory array, which can be implemented as described herein. In the schematic illustration of FIG. 19, a common source line 1928, a word line 1923 and a word line 1924 are arranged generally parallel in the Y-direction. Bit lines 1941 and 1942 are arranged generally parallel in the X-direction. Thus, a Y-decoder and a word line driver in block 1945 are coupled to the word lines 1923, 1924. An X-decoder and a set of sense amplifiers in block 1946 are coupled to the bit lines 1941 and 1942. The common source line 1928 is coupled to the source terminals of access transistors 1950, 1951, 1952 and 1953. The gate of access transistor 1950 is coupled to the word line 1923. The gate of access transistor 1951 is coupled to the word line 1924. The gate of access transistor 1952 is coupled to the word line 1923. The gate of access transistor 1953 is coupled to the word line 1924. The drain of access transistor 1950 is coupled to the bottom electrode member 1932 for memory cell 1935, which has top electrode member 1934. The top electrode member 1934 is coupled to the bit line 1941. Likewise, the drain of access transistor 1951 is coupled to the bottom electrode member 1933 for memory cell 1936, which has top electrode member 1937. The top electrode member 1937 is coupled to the bit line 1941. Access transistors 1952 and 1953 are coupled to corresponding memory cells as well on bit line 1942. It can be seen that in this illustrative configuration the common source line 1928 is shared by two rows of memory cells, where a row is arranged in the Y-direction in the illustrated schematic. In other embodiments, the access transistors can be replaced by diodes, or other structures for controlling current flow to selected devices in the array for reading and writing data.

Other embodiments are within the scope of the invention.

What is claimed is:

1. A memory cell device, comprising first and second electrodes, a plug of memory material in electrical contact with the second electrode, an electrically conductive film supported by a dielectric form, the dielectric form situated between the first electrode and the electrically conductive film, the dielectric form being wider at a bottom, the bottom resting on the first electrode, and narrower at a top, the top being towards the plug of memory material, the electrically conductive film being in electrical contact with the first electrode through opposed surfaces of each, and a cap film over the electrically conductive film, wherein the dielectric form has an outer surface which tapers inwardly from the first electrode towards the memory material plug so that the outer surface of the dielectric form is wider near the first electrode and is narrower near the memory material plug, wherein the cap film has an opening therethrough, the opening defining a recess and exposing a limited area of the electrically conductive film, wherein the memory material is over both the electrically conductive film and the cap film, wherein the memory material fills the recess and is in electrical contact with the limited area of the electrically conductive film, and wherein the limited area of the electrically conductive film is between the memory material and the dielectric form with the memory material being completely physically separated from the dielectric form.

2. The memory cell device of claim 1 wherein the dielectric form is shaped as a cone having a generally circular or elliptical base facing the first electrode.

3. The memory cell device of claim 1 wherein the dielectric form is shaped as a pyramid having a generally rectangular or square base facing the first electrode.

4. The memory cell device of claim 1 wherein the dielectric form is shaped as a wedge having an elongated generally rectangular base facing the first electrode.

5. The memory cell device of claim 1 wherein the dielectric form is shaped as a truncated cone with a base facing the first electrode.

6. The memory cell device of claim 1 wherein the dielectric form is shaped as pyramid with a base facing the first electrode.

7. The memory cell device of claim 1 wherein the dielectric form is shaped as a wedge with a base facing the first electrode.

8. The memory cell device of claim 1 wherein the electrically conductive film contacts only edge portions of the first electrode.

9. The memory cell device according to claim 1, wherein:
the opposed surface of the conductive film is a circumferentially-extending surface defining an open interior; and
the bottom of the dielectric form being within the open interior.

10. The memory cell device according to claim 1, wherein the memory material is over all of the cap film.

11. A memory cell device, comprising first and second electrodes, a plug of memory material in electrical contact with the second electrode, and an electrically conductive film supported by a dielectric form, the dielectric form being wider at a bottom, the bottom resting on the first electrode, and narrower at a top, the top being towards the plug of memory material, the electrically conductive film having first and second spaced-apart portions on opposite sides of the dielectric form, the dielectric form physically and electrically separating the first and second spaced apart portions, the first and second portions in electrical contact with the first electrode at first and second spaced-apart positions on the first electrode through opposed surfaces of each, wherein the memory material is over the electrically conductive film, a cap film over the electrically conductive film, wherein the cap film has an opening therethrough, the opening defining a recess, wherein the memory material is within the recess and is in electrical contact with the electrically conductive film, and wherein the electrically conductive film is between the memory material within the recess and the dielectric form with the memory material being completely physically separated from the dielectric form.

12. The memory cell device of claim 11 wherein the dielectric form is shaped as a cone having a generally circular or elliptical base facing the first electrode.

13. The memory cell device of claim 11 wherein the dielectric form is shaped as a pyramid having a generally rectangular or square base facing the first electrode.

14. The memory cell device of claim 11 wherein the dielectric form is shaped as a wedge having an elongated generally rectangular base facing the first electrode.

15. The memory cell device of claim 11 wherein the dielectric form is shaped as a truncated cone with a base facing the first electrode.

16. The memory cell device of claim 11 wherein the dielectric form is shaped as pyramid with a base facing the first electrode.

17. The memory cell device of claim 11 wherein the dielectric form is shaped as a wedge with a base facing the first electrode.

18. The memory cell device of claim 11 wherein the electrically conductive film contacts only edge portions of the first electrode.

19. A memory cell device, comprising;
first and second electrodes,
a dielectric form,
an electrically conductive film over the dielectric form, the electrically conductive film having first and second spaced-apart portions on opposite sides of the dielectric form, the dielectric form physically and electrically separating the first and second spaced apart portions, and the first and second spaced-apart portions in electrical contact with first and second spaced-apart positions on the first electrode through opposed surfaces of each,
the dielectric form being between the first electrode and the electrically conductive film,
a phase change material plug having a lower surface facing the first electrode,
the dielectric form being wider at a bottom, the bottom resting on the first electrode, and narrower at a top, the top being towards the phase change material plug,
a dielectric layer between the phase change material plug and the electrically conductive film,
the dielectric layer having an opening therethrough, the opening defining a recess exposing a limited area of the electrically conductive film, and
the lower surface of the phase change material plug comprising:
a first surface part,
a second surface part, the second surface part extending toward the first electrode and into the recess so to contact the limited area of the electrically conductive film,
the second surface part being closer to the first electrode than the first surface part, and
the electrically conductive film is between the second surface part of the phase change material plug and the dielectric form with the phase change material plug being completely physically separated from the dielectric form.

20. The memory cell device according to claim 19 wherein the dielectric form tapers inwardly from the first electrode towards the second surface part of the lower surface of the phase material plug.

21. The memory cell device according to claim 19 wherein said opposed surfaces directly contact one another.

* * * * *